United States Patent
Guo et al.

(10) Patent No.: US 9,734,795 B2
(45) Date of Patent: Aug. 15, 2017

(54) PIXEL ARRAY AND DRIVING METHOD THEREOF, DISPLAY PANEL AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Renwei Guo, Beijing (CN); Xue Dong, Beijing (CN)

(73) Assignees: BOE Technology Group Co. Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 222 days.

(21) Appl. No.: 14/429,903

(22) PCT Filed: Jul. 17, 2014

(86) PCT No.: PCT/CN2014/082430
§ 371 (c)(1),
(2) Date: Mar. 20, 2015

(87) PCT Pub. No.: WO2015/109784
PCT Pub. Date: Jul. 30, 2015

(65) Prior Publication Data
US 2016/0005382 A1    Jan. 7, 2016

(30) Foreign Application Priority Data

Jan. 26, 2014    (CN) .......................... 2014 1 0037405

(51) Int. Cl.
*G09G 5/10*        (2006.01)
*H01L 27/15*       (2006.01)
(Continued)

(52) U.S. Cl.
CPC ............ *G09G 5/10* (2013.01); *G09G 3/2003* (2013.01); *G09G 3/2074* (2013.01);
(Continued)

(58) Field of Classification Search
CPC ... G09G 2300/0443; G09G 2300/0452; G09G 2300/0465; G09G 2320/0646;
(Continued)

(56) References Cited

U.S. PATENT DOCUMENTS 5,311,337 A  *  5/1994  McCartney, Jr. . G02F 1/133514
                                                    349/109
6,768,482 B2     7/2004  Asano et al.
(Continued)

FOREIGN PATENT DOCUMENTS

CN    1376014 A    10/2002
CN    1725274 A    1/2006
(Continued)

OTHER PUBLICATIONS

Third Chinese Office Action of Chinese Application No. 201410037405.2, mailed Mar. 4, 2016 with English translation.
(Continued)

*Primary Examiner* — Hong Zhou
(74) *Attorney, Agent, or Firm* — Collard & Roe, P.C.

(57) ABSTRACT

A pixel array is provided and includes a plurality of pixel groups. Each of the pixel groups includes three sub-pixels disposed to encircle a center point, and each center point is encircled by three sub-pixels in a pixel group in the present row and the present column, one sub-pixel in a pixel group in the present row and the next column, one sub-pixel in a pixel group in the previous row and the previous column and one sub-pixel in a pixel group in the previous row and the
(Continued)

next column about it. A driving method for the pixel array, a display panel and a display device including the pixel array are provided.

15 Claims, 9 Drawing Sheets

(51) Int. Cl.
*G09G 3/20* (2006.01)
*H01L 27/32* (2006.01)
*G09G 3/3208* (2016.01)

(52) U.S. Cl.
CPC ......... *G09G 3/3208* (2013.01); *H01L 27/156* (2013.01); *H01L 27/3241* (2013.01); *G09G 2300/0443* (2013.01); *G09G 2300/0452* (2013.01); *G09G 2300/0465* (2013.01); *G09G 2320/0646* (2013.01)

(58) Field of Classification Search
CPC .. G09G 3/2003; G09G 3/2074; G09G 3/3208; G09G 5/10; H01L 27/156; H01L 27/3241; H01L 27/3213; H01L 27/3218
See application file for complete search history.

(56) References Cited

U.S. PATENT DOCUMENTS

| | | | |
|---|---|---|---|
| 7,990,496 | B2 | 8/2011 | Kwak et al. |
| 8,471,787 | B2 | 6/2013 | Ihata et al. |
| 8,570,272 | B2 | 10/2013 | Hsieh et al. |
| 8,598,784 | B2 | 12/2013 | Ko |
| 2002/0070909 | A1* | 6/2002 | Asano ................. G09G 3/3233 345/76 |
| 2006/0033422 | A1* | 2/2006 | Chao .................. H01L 27/3218 313/500 |
| 2006/0158466 | A1* | 7/2006 | Chien .................. G09G 3/2074 345/694 |
| 2006/0290870 | A1* | 12/2006 | Kwak ............... G02F 1/133514 349/144 |
| 2007/0279327 | A1* | 12/2007 | Yim ..................... G09G 3/2003 345/60 |
| 2008/0292207 | A1* | 11/2008 | Kang ..................... G06T 5/008 382/274 |
| 2009/0051627 | A1* | 2/2009 | Ihata .................... G09G 3/3208 345/76 |
| 2011/0012820 | A1 | 1/2011 | Kim et al. |
| 2015/0035731 | A1* | 2/2015 | Wang .................. H01L 27/3218 345/76 |

FOREIGN PATENT DOCUMENTS

| | | |
|---|---|---|
| CN | 1870277 A | 11/2006 |
| CN | 2899006 Y | 5/2007 |
| CN | 101373575 A | 2/2009 |
| CN | 101393366 A | 3/2009 |
| CN | 102855820 A | 1/2013 |
| CN | 203038924 U | 7/2013 |
| CN | 103824520 A | 5/2014 |
| TW | 201115248 A | 5/2011 |

OTHER PUBLICATIONS

International Search Report with Notice of Transmittal of the International Search Report of PCT/CN2014/082430 in Chinese, mailed Nov. 3, 2014.
Written Opinion of the International Searching Authority of PCT/CN2014/082430 in Chinese with English translation mailed Nov. 3, 2014.
Second Chinese Office Action of Chinese Application No. 201410037405.2, mailed Nov. 9, 2015 with English translation.
Chinese Office Action of Chinese Application No. 201410037405.2, mailed Sep. 7, 2015 with English translation.

* cited by examiner

US 9,734,795 B2

PIXEL ARRAY AND DRIVING METHOD THEREOF, DISPLAY PANEL AND DISPLAY DEVICE

CROSS REFERENCE TO RELATED APPLICATIONS

This application is the National Stage of PCT/CN2014/082430 filed on Jul. 17, 2014, which claims priority under 35 U.S.C. §119 of Chinese Application No. 201410037405.2 filed on Jan. 26, 2014, the disclosure of which is incorporated by reference.

TECHNICAL FIELD

Embodiments of the present invention relate to a pixel array and a driving method of the pixel array, as well as a display panel and a display device.

BACKGROUND

In display panels, a typical pixel design involves that three sub-pixels (including a red sub-pixel, a green sub-pixel and a blue sub-pixel) or four sub-pixels (a red sub-pixel, a green sub-pixel, a blue sub-pixel and a white sub-pixel) constitute one pixel (group) for display.

As user's demands on the feeling of watching a display screen improve (namely, a higher visual resolution is required, i.e., a display effect of higher resolution is achieved with relatively fewer physical pixels), it is necessary to increase the PPI (pixel per inch) of a display panel accordingly.

SUMMARY

According to embodiments of the present invention, there are provided a pixel array, a driving method of the pixel array, a display panel and a display device. By means of driving the pixel array with the driving method, the visual resolution of the display panel can be improved, that is, a display effect of higher resolution can be achieved with relatively fewer pixels.

According to at least an embodiment of the invention, there is provided a pixel array including a plurality of pixel groups, wherein, each of the pixel groups includes three sub-pixels disposed to encircle a center point, and each center point is encircled by three sub-pixels in a pixel group in the present row and the present column, one sub-pixel in a pixel group in the present row and the next column, one sub-pixel in a pixel group in the previous row and the previous column and one sub-pixel in a pixel group in the previous row and the next column about it.

According to at least an embodiment of the invention, there is provided a driving method of a pixel array, wherein, the pixel array is the pixel array provided as above, and the driving method includes: calculating a theoretical brightness value of a picture to be displayed at each sub-pixel; calculating an actual brightness value of each sub-pixel, an actual brightness value of each sub-pixel to be calculated including a sum of part of a theoretical brightness value of the sub-pixel to be calculated and at least part of a theoretical brightness value of at least one sub-pixel adjacent to and of the same color as the sub-pixel to be calculated; inputting a signal to each sub-pixel, so that the brightness of each sub-pixel reaches an actual brightness value obtained by calculation.

According to at least an embodiment of the invention, there is provided a display panel, comprising the pixel array as stated above.

According to at least an embodiment of the invention, there is provided a display device, comprising the display panel as stated above.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

Figure 1:
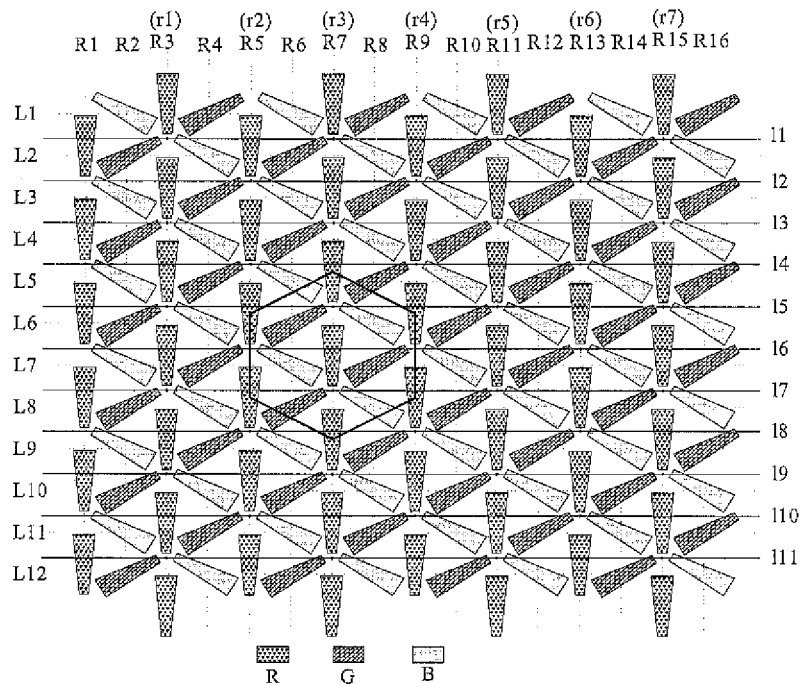
FIG. 1 is a diagram illustrating sub-pixels needed for sharing when an actual luminance of a sub-pixel in the L7th row and R8th column is calculated, in a driving method provided by Embodiment 1 of the invention.

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

As noticed by inventor(s) of the present application, if the PPI of a display panel is increased, then the technological difficulty of manufacturing the display panel is increased as well. So, it is required that the visual resolution of a display panel be increased without increasing the difficulty of manufacturing process, that is, a display effect of higher resolution can be achieved with relatively fewer pixels.

As shown in FIG. 1 to FIG. 17, at least an embodiment of the invention provides a pixel array, which includes a plurality of pixel groups. Each of the pixel groups includes three sub-pixels disposed to encircle a center point, and each center point is encircled, about it, by three sub-pixels in a pixel group in the present row and the present column, one sub-pixel in a pixel group in the present column and the next row, one sub-pixel in the previous row and the previous column and one sub-pixel in a pixel group in the previous row and the next column.

As shown in the figure, the three sub-pixels are a red sub-pixel R, a green sub-pixel G and a blue sub-pixel B. The places where three sub-pixels in each pixel group are located are on the upper side of a center point, the lower left side of the center point and the lower right side of the center point, respectively. These three sub-pixels are situated in these three places, respectively, and the concrete sequence of them will not be limited in the present invention.

For example, the red sub-pixel may be disposed above the center point, the green sub-pixel is correspondingly disposed on the lower left side or the lower right side of the center point, and the blue sub-pixel is correspondingly disposed on the lower right side or the lower left side of the center point.

Or, the green sub-pixel may be disposed above the center point, the red sub-pixel is correspondingly disposed on the lower left side or the lower right side of the center point, and the blue sub-pixel is correspondingly disposed on the lower right side or the lower left side of the center point.

Or, the blue sub-pixel may be disposed above the center point, the red sub-pixel is correspondingly disposed on the lower left side or the lower right side of the center point, and the red sub-pixel is correspondingly disposed on the lower right side or the lower left side of the center point.

For the sake of illustrative convenience, specific descriptions will be made in each of the following embodiments with reference to an arranging mode in which the red sub-pixel is disposed above the center point, the green sub-pixel is disposed on the lower left side of the center point, and the blue sub-pixel is disposed on the lower right side of the center point.

In the embodiment as shown in FIG. 1, L1, L2, . . . , L12 respectively represent sub-pixels in the L1th row, the L2th row, the L12th row; R1, R2, . . . , R16 respectively represent sub-pixels in the R1th column, the R2th column, . . . , the R16th column; 11, 12, . . . , 111 respectively represent pixel groups in the l1th row, the l2th row, . . . , the l11th row; and r1, r2, . . . , r7 respectively represent pixel groups in the r1th column, the r2th column, . . . , the r7th column. The arranging mode of the pixel groups is consistent with the arranging mode of the center points.

As can be seen from the figure, six sub-pixels encircling one center point are arranged in the shape of a flower, and each of the sub-pixels is equivalent to one petal. In each "flower" formed by arranging sub-pixels, sub-pixels of three colors appear alternately, so as to realize complementation. Therefore, when the below-mentioned driving method provided by embodiments of the invention is used for driving, a visual resolution exceeding the physical resolution can be obtained. That is, a display effect of higher resolution can be achieved with relatively fewer physical pixels.

It is easily understood that, three sub-pixels in each pixel group are situated in two different rows and three different columns, respectively. For example, in a pixel group in the l1th row and the r1th column, the green sub-pixel G is the sub-pixel in the L2th row and the R2th column, the red sub-pixel is the sub-pixel in the L1th row and the R3th column, and the blue sub-pixel is the sub-pixel in the L2th row and the R0th column.

Each of the sub-pixels may be a luminous element (e.g., an organic electroluminescent diode), and by applying a drive signal to each sub-pixel, each sub-pixel can be made to emit light of diverse brightness. When a pixel array provided by embodiments of the invention is used for display, a visual resolution exceeding the physical resolution can be obtained. That is, a display effect of higher resolution can be achieved with relatively fewer physical pixels.

In embodiments of the invention, the arranging mode of each sub-pixel in each of the pixel groups is not specially provided for. In at least an embodiment provided in the invention, in each of the pixel groups, the red sub-pixel R is disposed above the center point, the green sub-pixel G is disposed on the lower left side of the center point, and the blue sub-pixel B is disposed on the lower right side of the center point.

As shown in the figure, in each of the pixel groups, an angle between two adjacent sub-pixels may be 120 degrees (namely, three sub-pixels are evenly disposed on the periphery of the center point).

In embodiments of the invention, the shape of each of sub-pixels is not specially provided for. In at least an embodiment provided by the invention, each of the sub-pixels is a shape of a long strip (namely, the size of the sub-pixel in one direction is larger than its size in the other direction), and three of the sub-pixels are arranged radially on the periphery of the center point. Accordingly, six sub-pixels that belong to different pixel groups and encircle each of the center points are also arranged radially.

According to at least an embodiment of the invention, there is provided a driving method of a pixel array. The driving method of the embodiment may include the following steps:

S1, a theoretical brightness value of a picture to be displayed at each sub-pixel is calculated;

S2, an actual brightness value of each sub-pixel is calculated, and the actual brightness value of each of sub-pixels to be calculated includes a sum of part of a theoretical brightness value of the sub-pixel to be calculated and at least part of a theoretical brightness value of at least one sub-pixel adjacent to and of the same color as the sub-pixel to be calculated.

S3, a signal is input to each sub-pixel, so that the brightness of each sub-pixel reaches the actual brightness value obtained by calculation in the step S2.

In the above embodiment, the actual brightness output to each sub-pixel in the step S3 at least includes a sum of part of a theoretical brightness value of the sub-pixel and at least part of a theoretical brightness value of a sub-pixel adjacent to and of the same color as the sub-pixel. Upon display, one sub-pixel shares a luminance signal of other sub-pixel of the same color as and being adjacent to the sub-pixel.

When the above-mentioned method is used for driving a pixel array, a visual resolution of a display panel including the pixel array provided by embodiments of the invention can be improved to exceed the physical resolution of the display panel. That is, a display effect of higher resolution can be achieved with relatively fewer physical pixels.

It is easily understood that, "sub-pixel adjacent to and of the same color" here means that the sub-pixel has the same color as the sub-pixel to be calculated and there is no other sub-pixel of the same color between this sub-pixel and the sub-pixel to be calculated. For example, as shown in FIG. 1, when a red sub-pixel in the L7th row and the R7th column is the sub-pixel to be calculated, there are a total of six sub-pixels adjacent to and of the same color as the red sub-pixel in the L7th row and the R7th column, and they are: a red sub-pixel in the L6th row and the R5th column, a red sub-pixel in the L8th row and the R5th column, a red sub-pixel in the L5th row and the R7th column, a red sub-pixel in the L9th row and the R7th column, a red sub-pixel in the L6th row and the R9th column and a red sub-pixel in the L8th row and the R9th column.

When an actual brightness value of the red sub-pixel in the L7th row and the R7th column is calculated, one or more of the six red sub-pixels adjacent to it can be used.

An actual brightness value of each sub-pixel can be simply calculated based on the above method, for allowing a visual resolution of a display panel that includes the pixel array to be greater than a physical resolution of the display panel. That is, a display effect of higher resolution can be achieved with relatively fewer physical pixels.

In the invention, the number and location of sub-pixels adjacent to and of the same color as the sub-pixel to be calculated that are used in the step S2 are not specifically limited.

Figure 2:
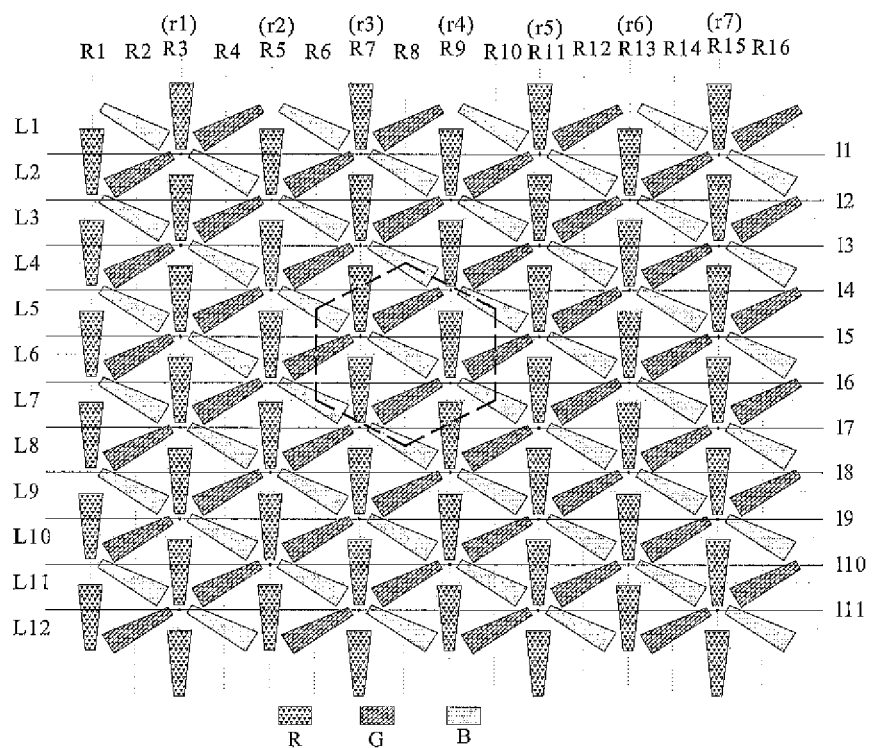
FIG. 2 is a diagram illustrating sub-pixels needed for sharing when an actual luminance of a sub-pixel in the L6th row and R8th column is calculated, in a driving method provided by Embodiment 1 of the invention.
Figure 3:
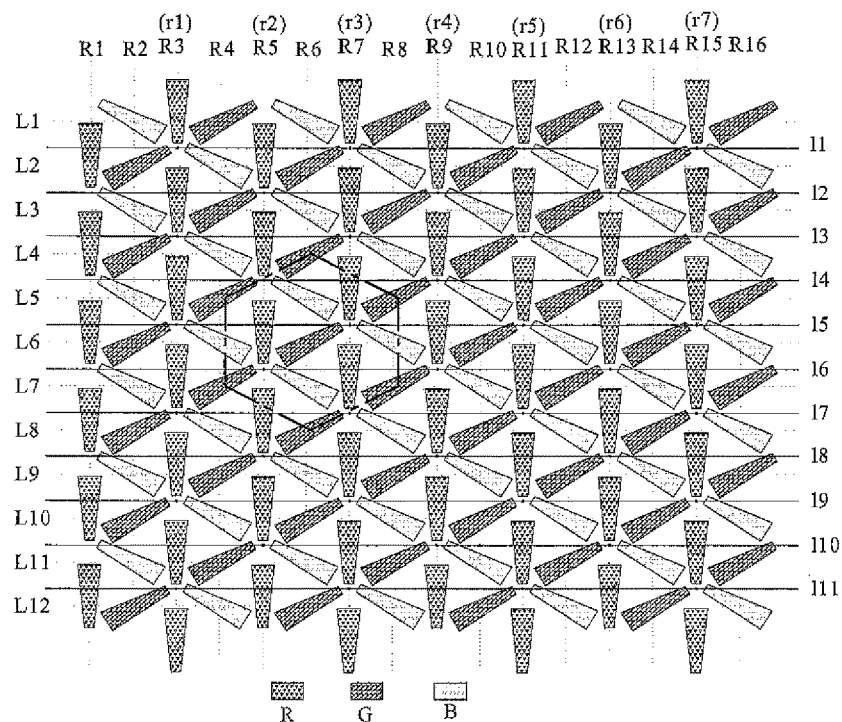
FIG. 3 is a diagram illustrating sub-pixels needed for sharing when an actual luminance of a sub-pixel in the L6th row and R6th column is calculated, in a driving method provided by Embodiment 1 of the invention.

With respect to the driving method provided by Embodiment 1 of the invention, as shown in FIG. 1 to FIG. 3, in the step S2, an actual brightness value of the sub-pixel to be calculated includes a sum of part of a theoretical brightness value of the sub-pixel to be calculated and at least part of theoretical brightness values of six sub-pixels adjacent to and of the same color as the sub-pixel to be calculated.

For example, as shown in FIG. 1, a red sub-pixel in the L7th row and the R7th column is the sub-pixel to be calculated, and when an actual brightness value of the sub-pixel to be calculated is computed, a theoretical brightness value of the sub-pixel to be calculated, a theoretical brightness value of a red sub-pixel in the L6th row and the R5th column, a theoretical brightness value of a red sub-pixel in the L8th row and the R5th column, a theoretical brightness value of a red sub-pixel in the L5th row and the R7th column, a theoretical brightness value of a red sub-pixel in the L9th row and the R7th column, and theoretical brightness values of a red sub-pixel in the L6th row and the R9th column and a red sub-pixel in the L8th row and the R9th column need to be used. As shown in the figure, the connecting lines of the midpoints of sub-pixels adjacent to and of the same color as the sub-pixel to be calculated form a hexagon.

As shown in FIG. 2, a blue sub-pixel in the L6th row and the R8th column is the sub-pixel to be calculated, and when an actual brightness value of the sub-pixel to be calculated is computed, a theoretical brightness value of the sub-pixel to be calculated, a theoretical brightness value of a blue sub-pixel in the L5th row and the R6th column, a theoretical brightness value of a blue sub-pixel in the L7th row and the Roth column, a theoretical brightness value of a blue sub-pixel in the L4th row and the R8th column, a theoretical brightness value of a blue sub-pixel in the L8th row and the R8th column, a theoretical brightness value of a blue sub-pixel in the L5th row and the R10th column and a theoretical brightness value of a blue sub-pixel in the L7th row and the R10th column need to be used. As shown in the figure, the connecting lines of the midpoints of sub-pixels adjacent to and of the same color as the sub-pixel to be calculated form a hexagon.

As shown in FIG. 3, a green sub-pixel in the L6th row and the Roth column is the sub-pixel to be calculated, and when an actual brightness value of the sub-pixel to be calculated is computed, a theoretical brightness value of the sub-pixel to be calculated, a theoretical brightness value of a green sub-pixel in the L5th row and the Roth column, a theoretical brightness value of a green sub-pixel in the L7th row and the Roth column, a theoretical brightness value of a green sub-pixel in the L4th row and the R6th column, a theoretical brightness value of a green sub-pixel in the L8th row and the R6th column, a theoretical brightness value of a green sub-pixel in the L5th row and the R8th column and a theoretical brightness value of a green sub-pixel in the L7th row and the R8th column need to be used. As shown in the figure, the connecting lines of the midpoints of sub-pixels adjacent to and of the same color as the sub-pixel to be calculated form a hexagon.

Figure 4:
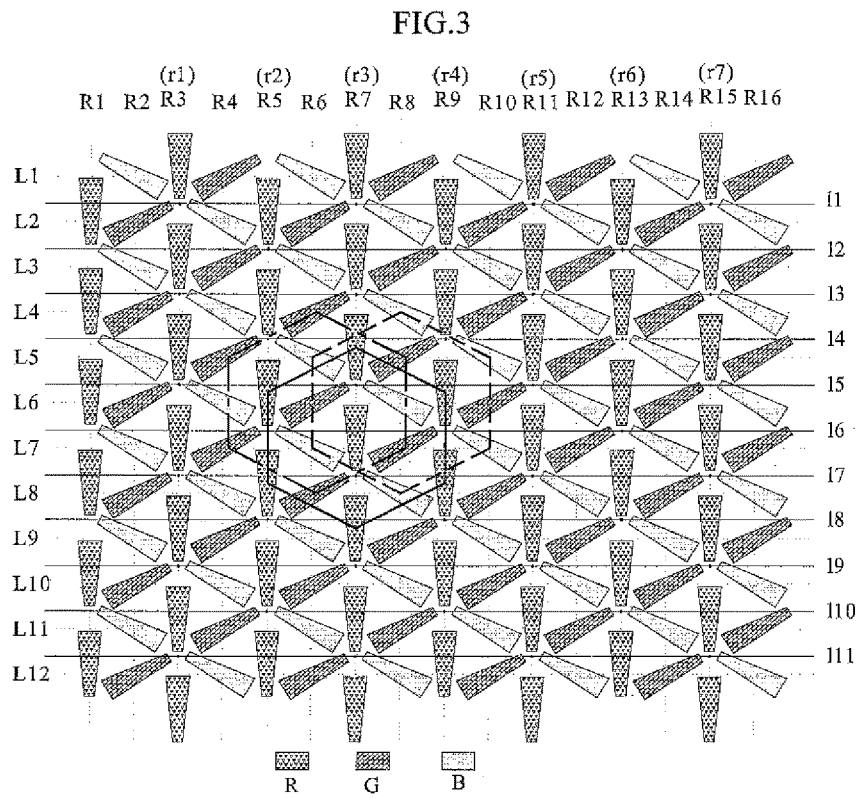
FIG. 4 is a diagram illustrating sub-pixels needed for sharing when the display of a different color is realized, in a driving method provided by Embodiment 1 of the invention.

It is widely known that, other color can be realized by mixing three primary colors of red, green and blue. As shown in FIG. 4, when a red sub-pixel in the L7th row and the R7th column, a blue sub-pixel in the L6th row and the R8th column and a green sub-pixel in the L6th row and the R6th column emit light according to different color mixing ratios, other color can be created by mixing.

In order to reduce the amount of calculation and raise the calculating speed, for example, regarding the driving method provided by Embodiment 2 of the invention, in the step S2, an actual brightness value of the sub-pixel to be calculated includes a sum of part of a theoretical brightness value of the sub-pixel to be calculated, part of a theoretical brightness value of a sub-pixel adjacent to and of the same color as the sub-pixel to be calculated in a pixel group in the next row, and part of a theoretical brightness value of a sub-pixel below the sub-pixel to be calculated in a pixel group in the same column, which is adjacent to and of the same color as the sub-pixel to be calculated.

It should be understood that, "a pixel group in the next row" refers to the next row of the pixel group, to which the sub-pixel to be calculated belongs. Also, "a pixel group in the same column" refers to the same column of the pixel group, to which the sub-pixel to be calculated belongs. The row where a center point of a pixel group sits is the row where the pixel group sits, and the column where a center point of a pixel group sits is the column where the pixel group sits.

Figure 5:
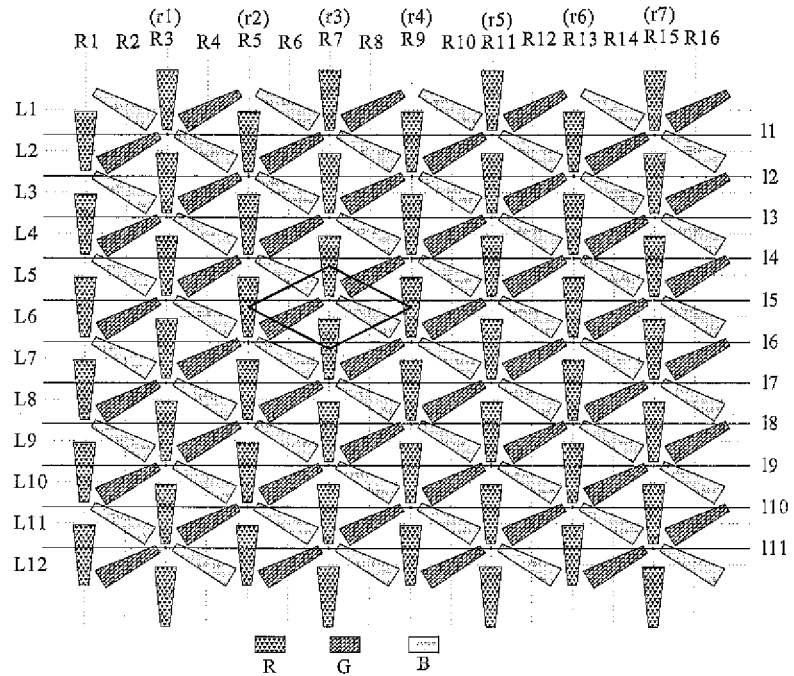
FIG. 5 is a diagram illustrating sub-pixels needed for sharing when an actual luminance of a sub-pixel in the L5th row and R7th column is calculated, in a driving method provided by Embodiment 2 of the invention.

As shown in FIG. 5, the sub-pixel to be calculated is a red sub-pixel in the L5th row and the R7th column in a pixel group in the l5th row and the r3th column, and when an actual brightness value of the sub-pixel to be calculated is computed, a theoretical brightness value of the sub-pixel to be calculated, a theoretical brightness value of a red sub-pixel in the L6th row and the R5th column in a pixel group in the l6th row and the r2th column, a theoretical brightness value of a red sub-pixel in the L6th row and the R9th column in a pixel group in the l6th row and the r4th column, and a theoretical brightness value of a red sub-pixel in the L7th row and the R7th column in a pixel group in the l7th row and the r3th column need to be used. Connecting lines of the midpoints of the sub-pixel to be calculated and sub-pixels involved in calculation form a parallelogram by surrounding.

Figure 6:
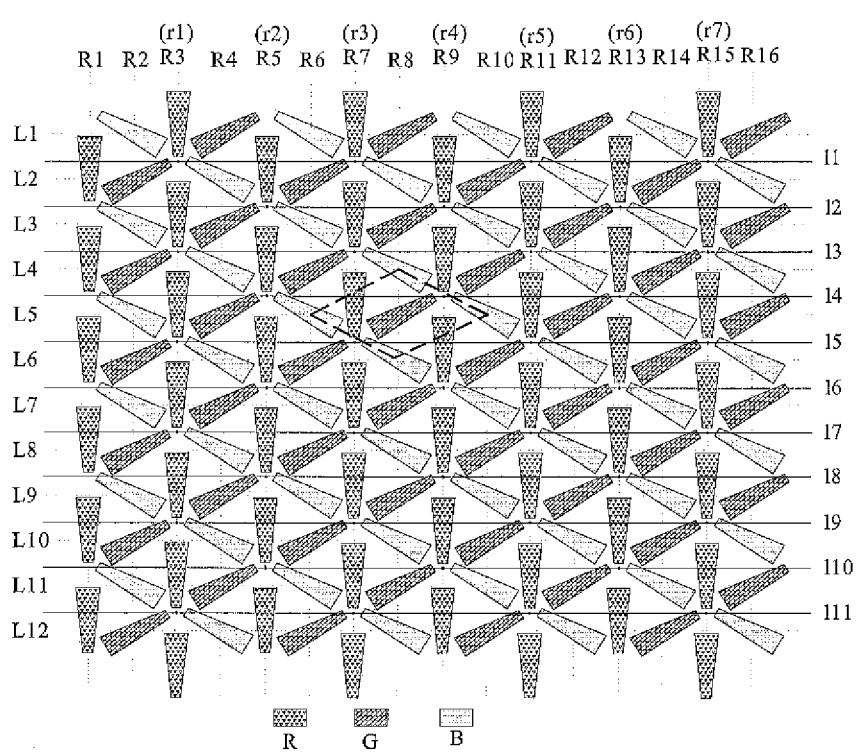
FIG. 6 is a diagram illustrating sub-pixels needed for sharing when an actual luminance of a sub-pixel in the L4th row and R8th column is calculated, in a driving method provided by Embodiment 2 of the invention.

Similarly, as shown in FIG. 6, a blue sub-pixel in the L4th row and the R8th column in a pixel group in the l3th row and the r3th column is the sub-pixel to be calculated, and when an actual brightness value of the sub-pixel to be calculated is computed, a theoretical brightness value of the sub-pixel to be calculated, a theoretical brightness value of a blue sub-pixel in the L5th row and the R6th column in a pixel group in the l4th row and the r2th column, a theoretical brightness value of a blue sub-pixel in the L5th row and the R10th column in a pixel group in the l4th row and the r4th column, and a theoretical brightness value of a blue sub-pixel in the L6th row and the R8th column in a pixel group in the l5th row and the r3th column need to be used.

Figure 7:
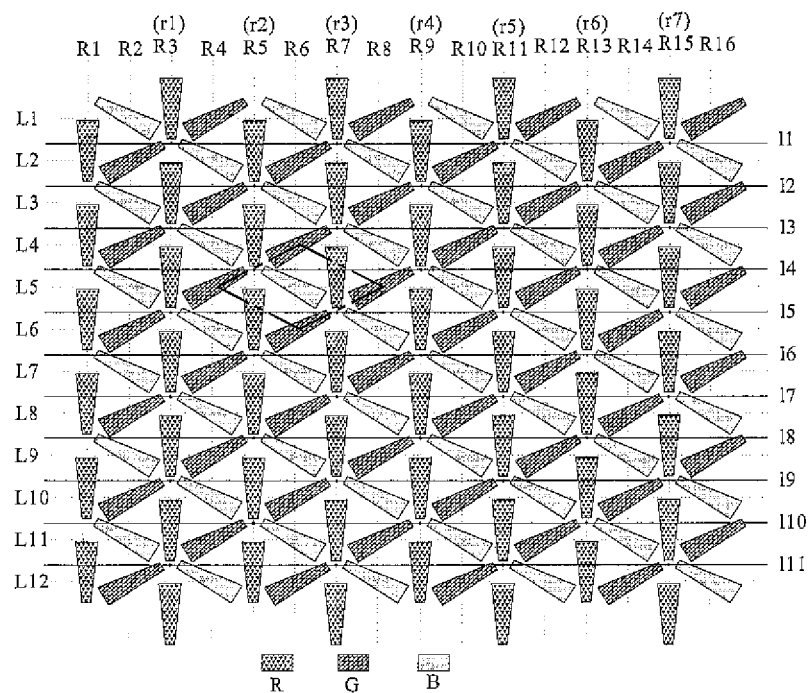
FIG. 7 is a diagram illustrating sub-pixels needed for sharing when an actual luminance of a sub-pixel in the L4th row and R6th column is calculated, in a driving method provided by Embodiment 2 of the invention.

As shown in FIG. 7, a green sub-pixel in the L4th row and the R6th column in a pixel group in the l3th row and the r3th column is the sub-pixel to be calculated, and when the actual brightness of the sub-pixel to be calculated is computed, a theoretical brightness value of a green sub-pixel in the L5th row and the R4th column in a pixel group in the l4th row and the r2th column, a theoretical brightness value of a green sub-pixel in the L5th row and the R8th column in a pixel group in the l4th row and the r3th column, and a theoretical brightness value of a green sub-pixel in the L6th row and the R6th column in a pixel group in the l5th row and the r3th column need to be used for calculating an actual brightness value of the sub-pixel to be calculated.

Figure 8:
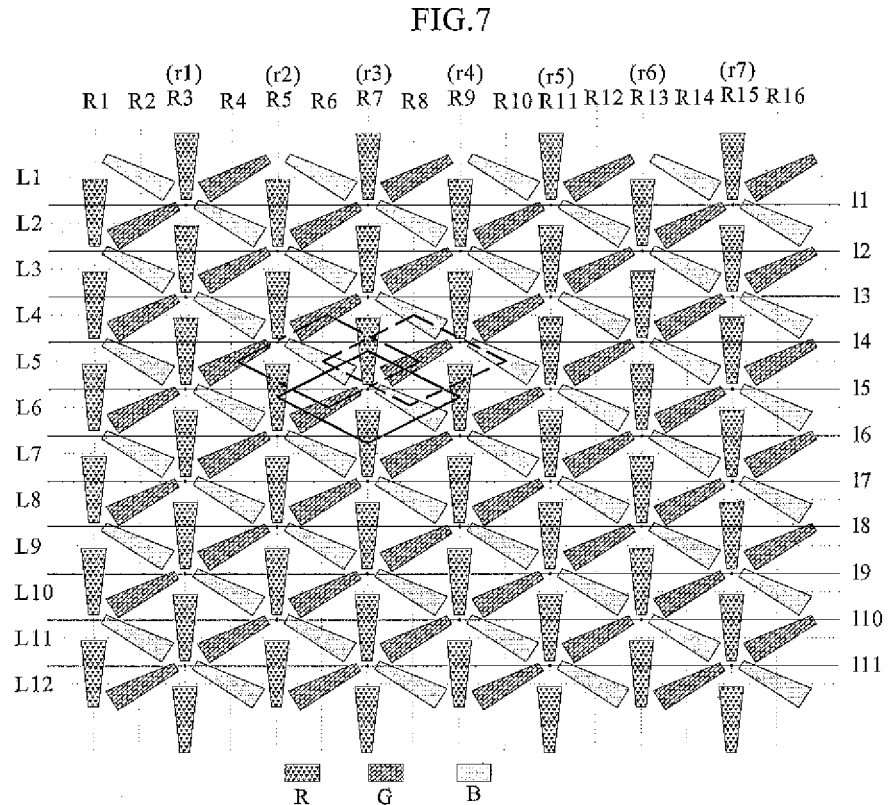
FIG. 8 is a diagram illustrating sub-pixels needed for sharing when the display of a different color is realized, in a driving method provided by Embodiment 2 of the invention.

FIG. 8 is a schematic view illustrating sub-pixels in need of sharing when the display of a different color is realized by driving the pixel array with the use of the driving method illustrated in Embodiment 2 of the invention.

As shown in FIG. 9 to FIG. 12, in a driving method illustrated in Embodiment 3 of the invention, in the step S2, an actual brightness value of the sub-pixel to be calculated may include a sum of part of a theoretical brightness value of the sub-pixel to be calculated and part of a theoretical brightness value of a sub-pixel adjacent to and of the same color as the sub-pixel to be calculated.

Figure 9:
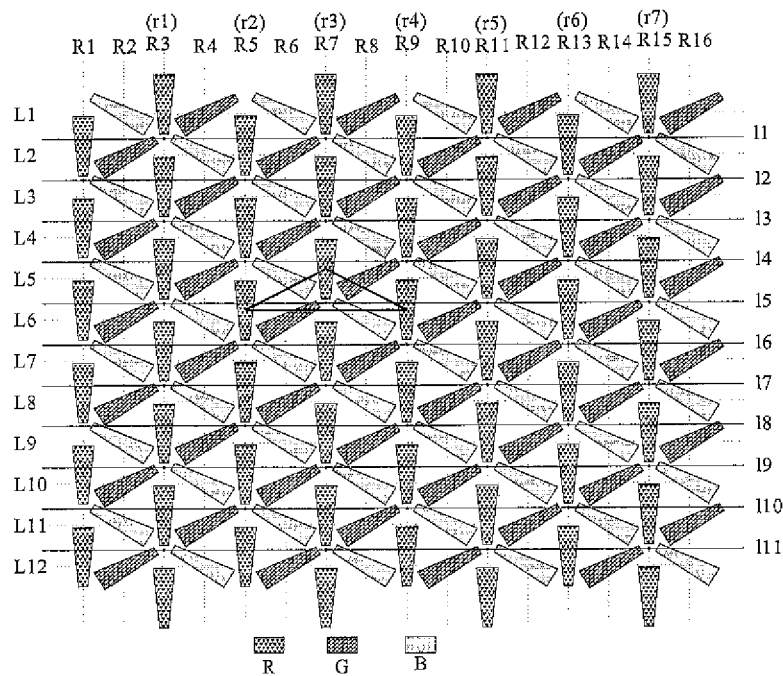
FIG. 9 is a diagram illustrating sub-pixels needed for sharing when an actual luminance of a sub-pixel in the L5th row and R7th column is calculated, in a driving method provided by Embodiment 3 of the invention.

As shown in FIG. 9, the sub-pixel to be calculated is a red sub-pixel in the L5th row and the R7th column in a pixel group in the l5th row and the r3th column, and when an actual brightness value of the sub-pixel to be calculated is computed, a theoretical brightness value of the sub-pixel to be calculated, a theoretical brightness value of a red sub-pixel in the L6th row and the R5th column in the l6th row and the r2th column, and a theoretical brightness value of a red sub-pixel in the L6th row and the R9th column in a pixel group in the l6th row and the r4th column need to be used. Connecting lines of the midpoints of the sub-pixel to be calculated and sub-pixels involved in calculation form an isosceles triangle by surrounding.

Figure 10:
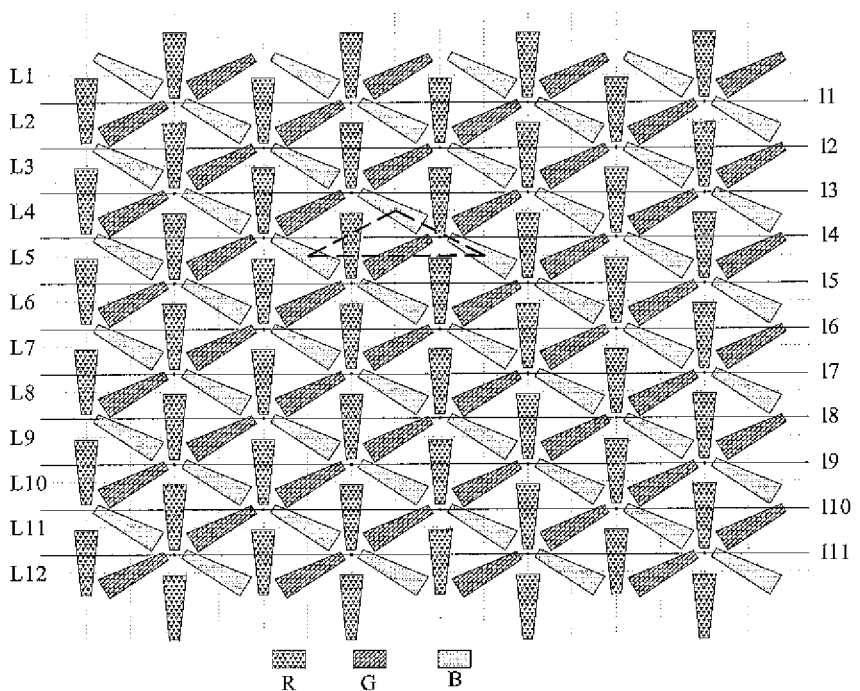
FIG. 10 is a diagram illustrating sub-pixels needed for sharing when an actual luminance of a sub-pixel in the L4th row and R8th column is calculated, in a driving method provided by Embodiment 3 of the invention.

Similarly, as shown in FIG. 10, a blue sub-pixel in the L4th row and the R8th column in a pixel group in the l3th row and the r3th column is the sub-pixel to be calculated, and when an actual brightness value of the sub-pixel to be calculated is computed, a theoretical brightness value of the sub-pixel to be calculated, a theoretical brightness value of a blue sub-pixel in the L5th row and the R6th column in a pixel group in the l4th row and the r2th column, and a theoretical brightness value of a blue sub-pixel in the L5th row and the R10th column in a pixel group in the l4th row and the r4th column need to be used.

Figure 11:
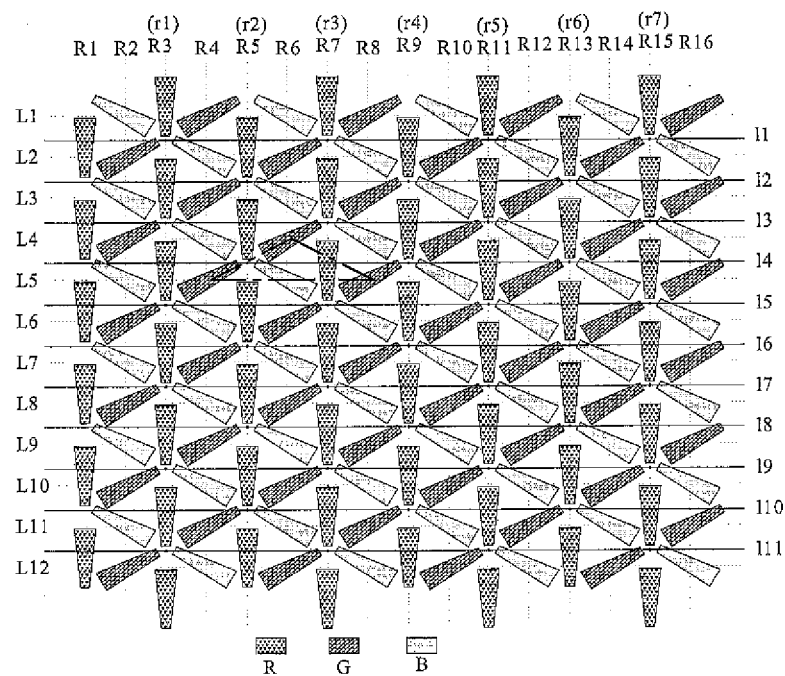
FIG. 11 is a diagram illustrating sub-pixels needed for sharing when an actual luminance of a sub-pixel in the L4th row and R6th column is calculated, in a driving method provided by Embodiment 3 of the invention.

As shown in FIG. 11, a green sub-pixel in the L4th row and the R6th column in a pixel group in the l3th row and the r3th column is the sub-pixel to be calculated, and when the actual brightness of the sub-pixel to be calculated is computed, a theoretical brightness value of a green sub-pixel in the L5th row and the Roth column in a pixel group in the l4th row and the r2th column, and a theoretical brightness value of a green sub-pixel in the L5th row and the R8th column in a pixel group in the l4th row and the r3th column need to be used for calculating an actual brightness value of the sub-pixel to be calculated.

Figure 12:
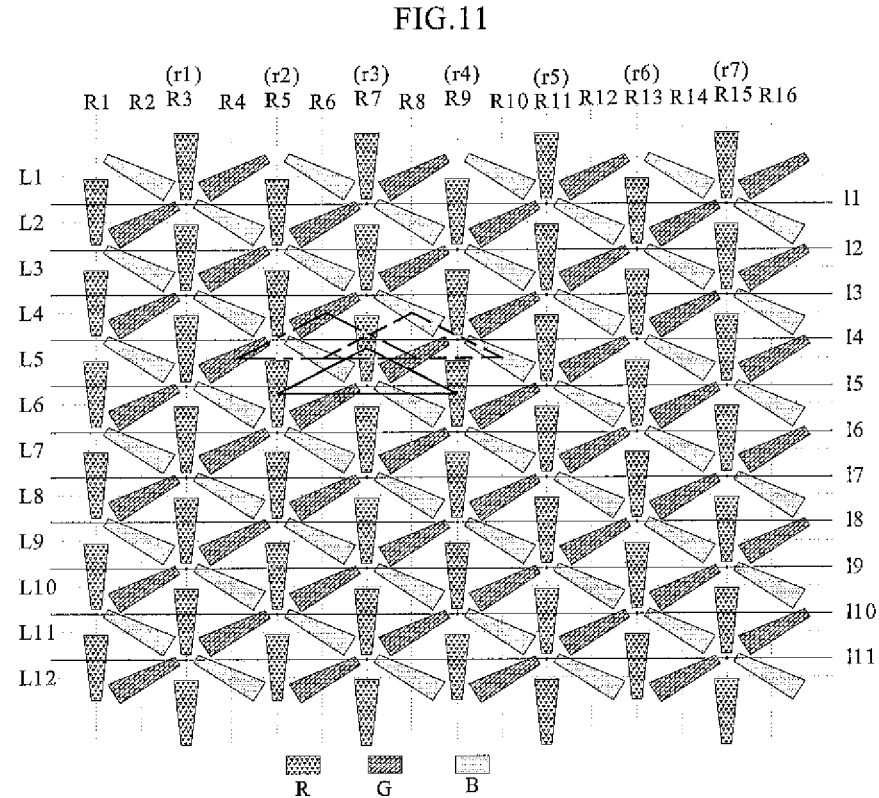
FIG. 12 is a diagram illustrating sub-pixels needed for sharing when the display of a different color is realized, in a driving method provided by Embodiment 3 of the invention.

That shown in FIG. 12 is a schematic view illustrating sub-pixels in need of sharing when the display of a different color is realized by driving the pixel array with the use of the driving method provided by Embodiment 3 of the invention.

In the driving method illustrated in Embodiment 4 of the invention, in the step S2, an actual brightness value of the sub-pixel to be calculated includes a sum of part of a theoretical brightness value of the sub-pixel to be calculated, part of a theoretical brightness value of one sub-pixel adjacent to and of the same color as the sub-pixel to be calculated in a pixel group in the next row, and part of a theoretical brightness value of a sub-pixel below the sub-pixel to be calculated in a pixel group in the same column, which is adjacent to and of the same color as the sub-pixel to be calculated.

Figure 13:
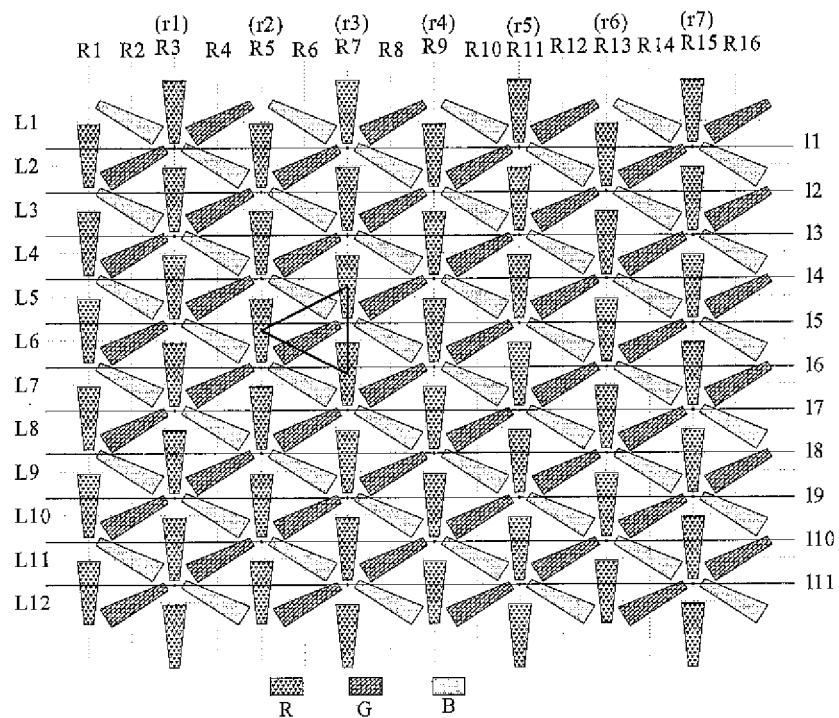
FIG. 13 is a diagram illustrating sub-pixels needed for sharing when an actual luminance of a sub-pixel in the L5th row and R7th column is calculated, in a driving method provided by Embodiment 4 of the invention.

As shown in FIG. 13, the sub-pixel to be calculated is a red sub-pixel in the L5th row and the R7th column in a pixel group in the l5th row and the r3th column, and when an actual brightness value of the sub-pixel to be calculated is computed, a theoretical brightness value of the sub-pixel to be calculated, a theoretical brightness value of a red sub-pixel in the L6th row and the R5th column in the l6th row and the r2th column, and a theoretical brightness value of a red sub-pixel in the L7th row and the R7th column in a pixel group in the l7th row and the r3th column need to be used. Connecting lines of the midpoints of the sub-pixel to be calculated and sub-pixels involved in calculation form an equilateral triangle by surrounding.

Figure 14:
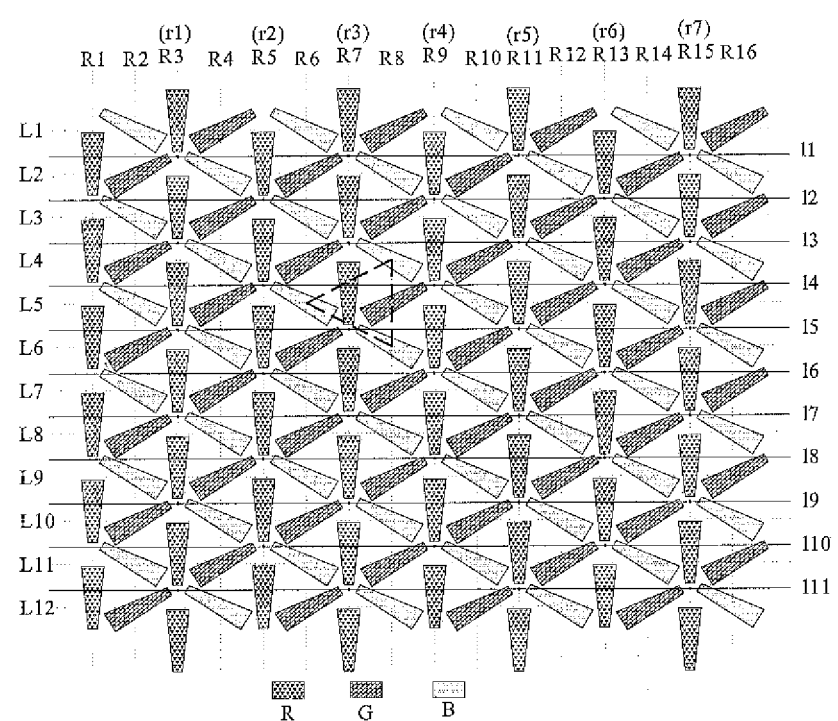
FIG. 14 is a diagram illustrating sub-pixels needed for sharing when an actual luminance of a sub-pixel in the L4th row and R8th column is calculated, in a driving method provided by Embodiment 4 of the invention.

Similarly, as shown in FIG. 14, a blue sub-pixel in the L4th row and the R8th column in a pixel group in the l3th row and the r3th column is the sub-pixel to be calculated, and when an actual brightness value of the sub-pixel to be calculated is computed, a theoretical brightness value of the sub-pixel to be calculated, a theoretical brightness value of a blue sub-pixel in the L5th row and the R6th column in a pixel group in the l4th row and the r2th column, and a theoretical brightness value of a blue sub-pixel in the L6th row and the R8th column in a pixel group in the l5th row and the r3th column need to be used.

Figure 15:
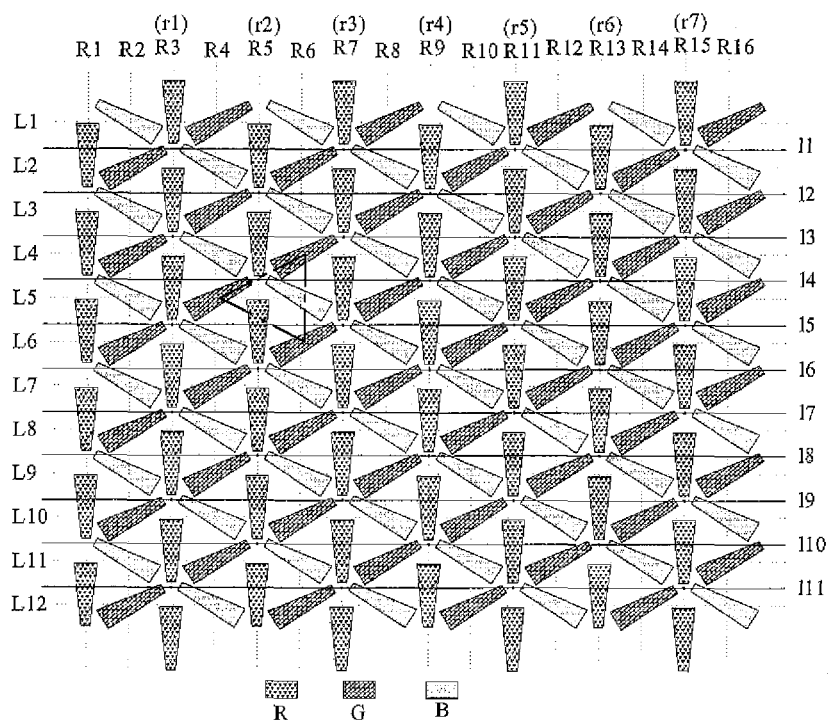
FIG. 15 is a diagram illustrating sub-pixels needed for sharing when an actual luminance of a sub-pixel in the L4th row and R6th column is calculated, in a driving method provided by Embodiment 4 of the invention.

As shown in FIG. 15, a green sub-pixel in the L4th row and the R6th column in a pixel group in the l3th row and the r3th column is the sub-pixel to be calculated, and when the actual brightness of the sub-pixel to be calculated is computed, a theoretical brightness value of a green sub-pixel in the L5th row and the R4th column in a pixel group in the l4th row and the r2th column, and a theoretical brightness value of a green sub-pixel in the L6th row and the R6th column in a pixel group in the l5th row and the r3th column need to be used for calculating an actual brightness value of the sub-pixel to be calculated.

Figure 16:
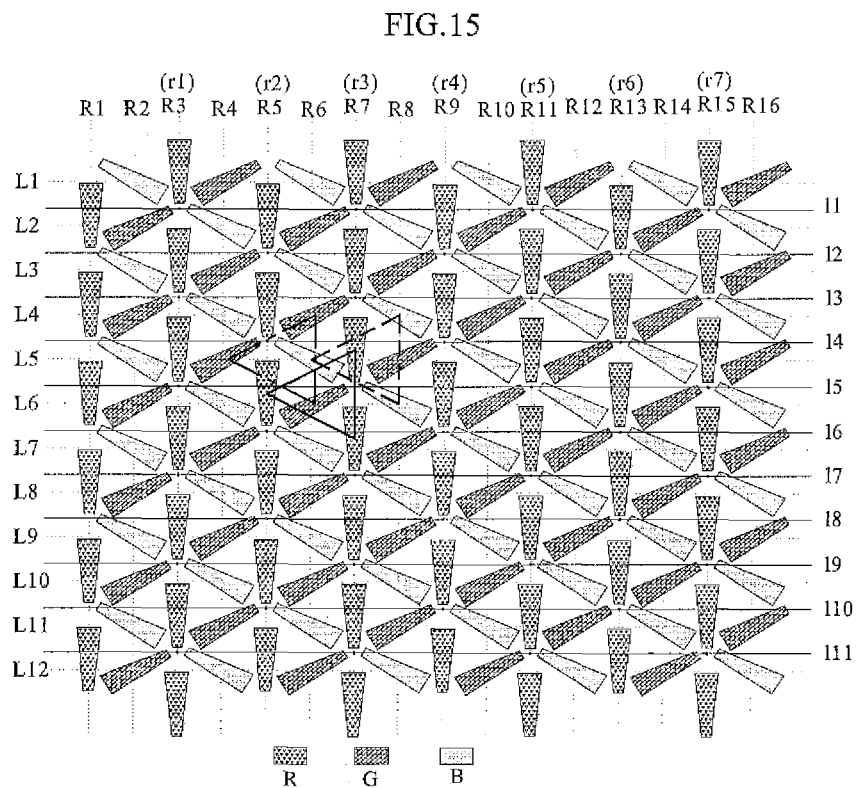
FIG. 16 is a diagram illustrating sub-pixels needed for sharing when the display of a different color is realized, in a driving method provided by Embodiment 4 of the invention.

That shown in FIG. 16 is a schematic view illustrating sub-pixels in need of sharing when the display of a different color is realized by driving the pixel array with the use of the driving method provided by Embodiment 4 of the invention.

Figure 17:
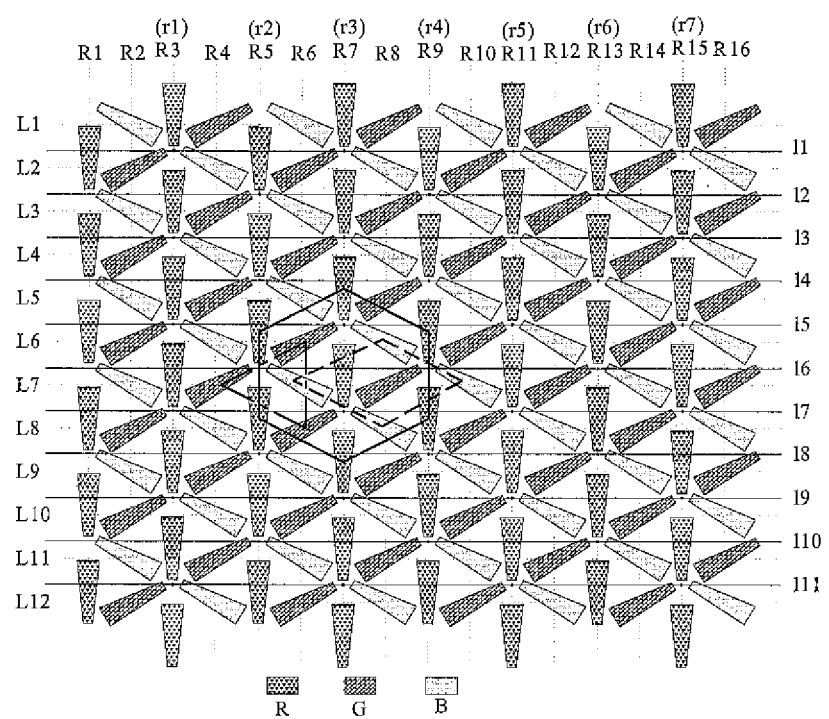
FIG. 17 is a diagram illustrating sub-pixels needed for sharing when the display of a different color is realized by using the provided driving method, according to a distinct embodiment of the invention.

In at least an embodiment of the invention, it is possible that the method illustrated by the same embodiment is used for driving each sub-pixel to give off light, or it is possible that methods illustrated by diverse embodiments are used for driving a plurality of sub-pixels to give off light. As shown in FIG. 17, it is possible that a red sub-pixel in the L7th row and the R7th column is driven to give off light by using Embodiment 1, a blue sub-pixel in the L6th row and the R8th column is driven to give off light by using Embodiment 2, and a green sub-pixel in the L6th row and the R6th column is driven to give off light by using Embodiment 4.

In at least an embodiment of the invention, between the step S1 and the step S2, the driving method may further include a step S151:

S151, a picture to be displayed is divided into a first zone and a second zone.

In the first zone, in the step S2, an actual brightness value of the sub-pixel to be calculated includes a sum of part of a theoretical brightness value of the sub-pixel to be calculated and part of a theoretical brightness value of a sub-pixel adjacent to and of the same color as the sub-pixel to be calculated in a pixel group in the next row (i.e., embodiment 3); or, in the step S2, an actual brightness value of the sub-pixel to be calculated includes a sum of part of a theoretical brightness value of the sub-pixel to be calculated, part of a theoretical brightness value of one sub-pixel adjacent to and of the same color as the sub-pixel to be calculated in a pixel group in the next row, and part of a theoretical brightness value of a sub-pixel below the sub-pixel to be calculated in a pixel group in the same column, which is adjacent to and of the same color as the sub-pixel to be calculated (i.e., embodiment 4); and/or In the second zone, in the step S2, an actual brightness value of the sub-pixel to be calculated includes a sum of part of a theoretical brightness value of the sub-pixel to be calculated and at least part of a theoretical brightness value of six sub-pixels adjacent to and of the same color as the sub-pixel to be calculated (i.e., embodiment 1); or, in the step S2, an actual brightness value of the sub-pixel to be calculated includes a sum of part of a theoretical brightness value of the sub-pixel to be calculated, part of a theoretical brightness value of a sub-pixel adjacent to and of the same color as the sub-pixel to be calculated in a pixel group in the next row, and part of a theoretical brightness value of a sub-pixel below the sub-pixel to be calculated in a pixel group in the same column, which is adjacent to and of the same color as the sub-pixel to be calculated (i.e., embodiment 2).

In Embodiment 1 and Embodiment 2, when an actual brightness value of the sub-pixel to be calculated is computed, the number of sub-pixels adjacent to and of the same color as it in need of employing is relatively greater, and the sampling area is relatively larger. They are especially suitable for displaying a scenery picture, and the viewer's visual feeling can be increased.

In Embodiment 3 and Embodiment 4, when an actual brightness value of the sub-pixel to be calculated is computed, the number of sub-pixels adjacent to and of the same color as it in need of employing is relatively smaller, and the sampling area is relatively smaller. Thus, they are suitable for displaying a fine picture (i.e., having relatively more color kinds) or a boundary region of a realistic graph.

Therefore, the color category in the first zone is more than the color category in the second zone.

For example, the first zone may include a boundary region of a graph in the picture to be displayed, and the second zone may include a middle region of a graph in the picture to be displayed.

It should be understood that, "the middle region of the graph in the picture to be displayed" stated herein does not refer to a geometrical center of the graph, but refers to a region inside the boundary of the graph.

According to at least an embodiment of the invention, there is provided a display panel, which includes the pixel array provided by at least an embodiment of the invention. As can be known from the foregoing descriptions, the display panel provided by embodiments of the invention has a higher visual resolution. That is, a display effect of higher resolution can be achieved with relatively fewer physical pixels.

According to at least an embodiment of the invention, there is provided a display device, which includes the above display panel provided by at least an embodiment of the invention. The display device may be a cell phone, a computer, or the like.

Descriptions made above are merely exemplary embodiments of the invention, and are not used to limit the protection scope of the invention. The protection scope of the invention is determined by attached claims.

This application claims the benefit of priority from Chinese patent application No. 201410037405.2, filed on Jan. 26, 2014, the disclosure of which is incorporated herein in its entirety by reference as part of the present application.

What is claimed is:

1. A pixel array, comprising a plurality of pixel groups arranged in rows and columns, wherein,
   each of the pixel groups includes a center point and three sub-pixels disposed to encircle the center point;
   as for the pixel group in a row M and a column N, the center point of the pixel group is encircled, about the center point of the pixel group, by six sub-pixels in total: three of the six sub-pixels are in the pixel group in the row M and the column N, one of the six sub-pixels is in a pixel group in a row M+2 and the column N, one of the six sub-pixels is in a pixel group in a row M−1 and a column N−1, and one of the six sub-pixels is in a pixel group in the row M−1 and a column N+1, 1<N, 1<M.

2. The pixel array claimed as claim 1, wherein, the sub-pixels in each of the pixel groups include a red sub-pixel, a green sub-pixel and a blue sub-pixel, and the red sub-pixel is disposed above the center point, the green sub-pixel is disposed on a lower left side or a lower right side of the center point, and the blue sub-pixel is disposed on the lower right side or the lower left side of the center point; or
   the green sub-pixel is disposed above the center point, the red sub-pixel is disposed on the lower left side or the lower right side of the center point, and the blue sub-pixel is disposed on the lower right side or the lower left side of the center point; or the blue sub-pixel is disposed above the center point, the red sub-pixel is disposed on the lower left side or the lower right side of the center point, and the red sub-pixel is disposed on the lower right side or the lower left side of the center point.

3. The pixel array claimed as claim 2, wherein, each of the sub-pixels is in a shape of a long strip, and the three sub-pixels are arranged radially on the periphery of the center point.

4. The pixel array claimed as claim 1, wherein, each of the sub-pixels is in a shape of a long strip, and the three sub-pixels are arranged radially on the periphery of the center point.

5. A driving method of a pixel array, the pixel array being the pixel array claimed as claim 1, the driving method comprising:

calculating a theoretical brightness value of a picture to be displayed at each sub-pixel;

calculating an actual brightness value of each sub-pixel, the actual brightness value of each sub-pixel to be calculated comprising a sum of part of a theoretical brightness value of the sub-pixel to be calculated and at least part of a theoretical brightness value of at least one sub-pixel adjacent to and of the same color as the sub-pixel to be calculated;

inputting a signal to each sub-pixel, so that the brightness of each sub-pixel reaches the actual brightness value obtained by calculation.

6. The driving method claimed as claim 5, wherein, the actual brightness value of the sub-pixel to be calculated comprises a sum of part of the theoretical brightness value of the sub-pixel to be calculated and at least part of a theoretical brightness value of six sub-pixels adjacent to and of the same color as the sub-pixel to be calculated.

7. The driving method claimed as claim 5, wherein, the actual brightness value of the sub-pixel to be calculated comprises a sum of part of the theoretical brightness value of the sub-pixel to be calculated, part of a theoretical brightness value of a sub-pixel in a pixel group in a next row that is adjacent to and of the same color as the sub-pixel to be calculated, and part of a theoretical brightness value of a sub-pixel below the sub-pixel to be calculated in a pixel group in the same column, which is adjacent to and of the same color as the sub-pixel to be calculated.

8. The driving method claimed as claim 5, wherein, the actual brightness value of the sub-pixel to be calculated comprises a sum of part of the theoretical brightness value of the sub-pixel to be calculated and part of a theoretical brightness value of a sub-pixel in a pixel group in a next row that is adjacent to and of the same color as the sub-pixel to be calculated.

9. The driving method claimed as claim 5, wherein, the actual brightness value of the sub-pixel to be calculated comprises a sum of part of the theoretical brightness value of the sub-pixel to be calculated, part of a theoretical brightness value of one sub-pixel in a pixel group in a next row that is adjacent to and of the same color as the sub-pixel to be calculated, and part of a theoretical brightness value of a sub-pixel below the sub-pixel to be calculated in a pixel group in the same column, which is adjacent to and of the same color as the sub-pixel to be calculated.

10. The driving method claimed as claim 5, further comprising:

dividing the picture to be displayed into a first zone and a second zone;

wherein, in the first zone, the actual brightness value of the sub-pixel to be calculated comprises a sum of part of the theoretical brightness value of the sub-pixel to be calculated and part of a theoretical brightness value of a sub-pixel in a pixel group in a next row that is adjacent to and of the same color as the sub-pixel to be calculated; or in the first zone, the actual brightness value of the sub-pixel to be calculated comprises a sum of part of the theoretical brightness value of the sub-pixel to be calculated, part of a theoretical brightness value of one sub-pixel in a pixel group in the next row that is adjacent to and of the same color as the sub-pixel to be calculated, and part of a theoretical brightness value of a sub-pixel below the sub-pixel to be calculated in a pixel group in the same column, which is adjacent to and of the same color as the sub-pixel to be calculated; and/or in the second zone, the actual brightness value of the sub-pixel to be calculated comprises a sum of part of the theoretical brightness value of the sub-pixel to be calculated and at least part of a theoretical brightness value of six sub-pixels adjacent to and of the same color as the sub-pixel to be calculated;

or, in the second zone, the actual brightness value of the sub-pixel to be calculated comprises a sum of part of the theoretical brightness value of the sub-pixel to be calculated, part of a theoretical brightness value of a sub-pixel in a pixel group in the next row that is adjacent to and of the same color as the sub-pixel to be calculated, and part of a theoretical brightness value of a sub-pixel below the sub-pixel to be calculated in a pixel group in the same column, which is adjacent to and of the same color as the sub-pixel to be calculated.

11. The driving method claimed as claim 10, wherein, the color category in the first zone is more than the color category in the second zone.

12. The driving method claimed as claim 11, wherein, the first zone comprises a boundary region of a graph in a picture to be displayed, and the second zone comprises a middle region of a graph in the picture to be displayed.

13. The driving method claimed as claim 10, wherein, the first zone comprises a boundary region of a graph in a picture to be displayed, and the second zone comprises a middle region of a graph in the picture to be displayed.

14. A display panel, comprising a pixel array, wherein the pixel array is the pixel array claimed as claim 1.

15. A display device, comprising a display panel, wherein the display panel is the display panel claimed as claim 14.

* * * * *